(12) United States Patent
Sakamoto et al.

(10) Patent No.: US 9,076,985 B2
(45) Date of Patent: Jul. 7, 2015

(54) DISPLAY DEVICE AND METHOD FOR PRODUCING THE SAME

(71) Applicant: Japan Display Inc., Tokyo (JP)

(72) Inventors: Hirotsugu Sakamoto, Tokyo (JP); Hiroshi Oooka, Tokyo (JP); Takeshi Ookawara, Tokyo (JP); Kouhei Takahashi, Tokyo (JP); Yuko Matsumoto, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/289,687

(22) Filed: May 29, 2014

(65) Prior Publication Data

US 2014/0353639 A1    Dec. 4, 2014

(30) Foreign Application Priority Data

May 29, 2013    (JP) .................. 2013-112610

(51) Int. Cl.
*H01L 51/56*    (2006.01)
*H01L 51/52*    (2006.01)
*H01L 27/32*    (2006.01)

(52) U.S. Cl.
CPC ........ *H01L 51/5246* (2013.01); *H01L 27/3246* (2013.01); *H01L 51/56* (2013.01); *H01L 2227/323* (2013.01)

(58) Field of Classification Search
CPC . H01L 51/5246; H01L 51/56; H01L 27/3246; H01L 2227/323
See application file for complete search history.

(56) References Cited

U.S. PATENT DOCUMENTS

| 8,357,929 | B2 | 1/2013 | Ryu et al. | |
|---|---|---|---|---|
| 2013/0049184 | A1* | 2/2013 | Kasahara et al. | 257/687 |
| 2014/0042408 | A1* | 2/2014 | Akagawa et al. | 257/40 |
| 2014/0077171 | A1* | 3/2014 | Yamakita et al. | 257/40 |

FOREIGN PATENT DOCUMENTS

JP    2010-225569 A    10/2010

* cited by examiner

*Primary Examiner* — Roy Potter
*Assistant Examiner* — Paul Patton
(74) *Attorney, Agent, or Firm* — Lowe Hauptman & Ham, LLP

(57) ABSTRACT

A display device which can be produced at reduced material cost and has a smaller peripheral frame area, and a method for producing the same, are provided. A display device includes a first substrate including a display area, which includes an organic EL light emitting layer; a second substrate located so as to face the first substrate; a dam member located along, and outside with respect to, a part of an outer edge of the display area, the dam member joining the first substrate and the second substrate to each other; and a filler filling a space between the first substrate and the second substrate while being in contact with the dam member.

14 Claims, 13 Drawing Sheets

DISPLAY DEVICE AND METHOD FOR PRODUCING THE SAME

CROSS-REFERENCE TO RELATED APPLICATIONS

This application is based upon and claims the benefit of priority from the prior Japanese Patent Application No. 2013-112610, filed on 29 May 2013, the entire contents of which are incorporated herein by reference.

FIELD

The present invention relates to a display device including sealing means for an organic EL (electro-luminescence) light emitting layer, and a method for producing the same.

BACKGROUND

Recently, OLED (organic light-emitting diode) display devices have been actively developed as display devices which are thin, have high luminance and are operable at high speed. An OLED display device has a display panel which includes pixels formed of organic compound light emitting diodes. OLED display panels have a high reaction rate because no mechanical operations are performed, provide high luminance display because each of the pixels themselves emits light, and can be thin because no backlight unit is required. For these reasons, OLED display panels are favorably expected to be next generation display panels.

An organic EL light emitting layer is rapidly deteriorated when being exposed to moisture in an atmosphere, and thus needs to be sealed in against external air. Therefore, the organic EL light emitting layer has a surface covered with a transparent sealing film formed of, for example, a CVD-formed SiN film or the like, which is covered with a substrate formed of a hard transparent material such as glass or the like.

In a conventional OLED display device, a gap between the substrate and the sealing film is filled with, for example, a transparent resin (ultraviolet-curable resin, thermosetting resin, etc.) such as an epoxy resin or the like (see, for example, Patent Document 1, "Japanese Laid-Open Patent Publication No. 2010-225569"). Such a structure is provided in order to keep a certain distance between the substrate and the sealing film so that the surface of the organic EL light emitting layer and a surface of the substrate are kept parallel to each other, and also in order to prevent reflection or refraction at an interface between the substrate and the sealing film. More specifically, a resin having a relatively high pre-curing viscosity is formed in a frame shape, and a space enclosed by the resin is filled with a resin having a relatively low pre-curing viscosity. Hereinafter, in order to distinguish these resins having different functions, a resin having a relatively high pre-curing viscosity will be referred to as a "dam material", and a resin having a relatively low pre-curing viscosity will be referred to as a "filler".

Hereinafter, with reference to FIG. 11 through FIG. 13, a method for producing a conventional OLED display device 50 will be described. FIG. 11 shows a schematic structure of the conventional OLED display device 50. FIG. 11(a) is a planar see-through view of the OLED display device 50, and FIG. 11(b) is a cross-sectional view of the OLED display device 50 shown in FIG. 11(a). FIG. 12 is an enlarged view of part C enclosed by dashed line in FIG. 11(a). FIG. 13 shows a production step of the conventional OLED display devices 50. FIG. 13(a) is a planar see-through view showing the production step of the conventional OLED display devices 50 shown in FIG. 11(a). FIG. 13(b) is a cross-sectional view of the OLED display device 50 taken along line Z-Z' in FIG. 13(a).

FIG. 11(a) is a planar see-through view of the OLED display device 50 showing a shape of a surface of a first substrate 51 having a dam member 53 formed thereon. The first substrate 51 is seen through a second substrate 52 and a filler 54. As shown in FIG. 11(a), the dam member 53 is formed on the first substrate 51 in a frame shape by applying a dam material thereto by use of a dispenser or the like. An area 51a of the first substrate 51 shown in FIG. 11(a) is a terminal area on which, for example, a driver for driving a TFT driving circuit layer in an organic EL light emitting layer 1 is formed. The dam member 53 is formed along an outer edge of an area of the surface of the first substrate 51 that excludes the terminal area 51a. As shown in FIG. 12, the dam member 53 is applied so as to enclose an outer edge of a display area (where effective pixels contributing to display are present) 55 which includes the organic EL light emitting layer 1 formed in the first substrate 51. The dam member 53 is provided outside with respect to the outer edge of the display area 55 in order to prevent the phenomenon that a minute refractive index difference between the dam member 53 and the filler 54 causes a refractive index distribution on the organic EL light emitting layer 1, which would distort a displayed image.

Next, a space inside with respect to the dam member 53 provided on the first substrate 51 is filled with the filler 54, and the first substrate 51 and the second substrate 52 are put together. Then, the dam member 53 and the filler 54 are cured.

In the example of FIGS. 11(a) and (b), one first substrate 51 is used to form one OLED display device. It should be noted that in an actual production method, as shown in FIG. 13(a), one first substrate 51 is used to form a plurality of OLED display devices. After the filler 54 is cured and thus the first substrate 51 and the second substrate 52 are joined together, such first substrate 51 and the second substrate 52 joined together are cut to provide individual OLED display devices 50.

In FIGS. 13(a) and (b), dashed lines A1-1 through A1-7 and A3-1 through A3-7 represent cutting lines along which the first substrate 51 and the second substrate 52 are to be cut. Dashed lines B-1 through B-5 represent cutting lines along which the second substrate 52 is to be cut. The first substrate 51 and the second substrate 52 are cut at predetermined positions along the cutting lines A1-1 through A1-6, A3-1 through A3-6, and B-1 through B-5 by use of a scribe and break technique or the like. As a result, a plurality of the OLED display devices 50 shown in FIGS. 11(a) and (b) are obtained. In FIG. 11(a), dashed line 52' represents the position along which the second substrate 52 is located as overlapping the first substrate 51. As shown in FIG. 11(b), the second substrate 52 is not located on the terminal area 51a, and the terminal area 51a is exposed in the state of not being covered with the second substrate 52.

In the above-described conventional OLED display device 50, the dam member 53 is formed in a frame shape enclosing the display area 55. Therefore, each OLED display device 50 needs to preserve a frame-shaped area for the dam member 53 in a peripheral frame area enclosing the display area 55. This makes it difficult to decrease the size of the peripheral frame area.

In addition, in order to form a plurality of the dam members 53, the dam material needs to be applied to the first substrate 51 by use of a dispenser or the like to draw frame shapes enclosing the display areas 55 with a certain size. This step has problem of being time-consuming and also needing to be performed at high precision.

The present invention for solving these problems of the conventional structure has an object of providing a display device which can be produced by a simple method at low material cost and also has a small size of peripheral frame area, and a method for producing such a display device.

SUMMARY

A display device according to an embodiment of the present invention includes a first substrate including an organic EL light emitting layer; a second substrate located so as to face the first substrate; a dam member located between the first substrate and the second substrate and along, and outside with respect to, a part of an outer edge of a display area which includes the organic EL light emitting layer; and a filler filling a space enclosed by the first substrate, the second substrate and the dam member.

A method for producing a display device according to an embodiment of the present invention includes forming a plurality of organic EL light emitting layers, each of which is included in a display area on which an image is to be formed, in the first substrate in a matrix at a predetermined interval, and forming a plurality of terminal areas respectively adjacent to the plurality of display areas in a first direction; forming a sealing film on the first substrate in which the plurality of organic EL light emitting layers and the plurality of terminal areas are formed; forming a plurality of dam members on the sealing film, wherein the plurality of dam members extend in a second direction, perpendicular to the first direction, between the display areas and the terminal areas, and each of the dam members encloses a row of a plurality of display areas adjacent to each other in the second direction; filling a space enclosed by each of the dam members with a filler; putting the first substrate and the second substrate together with the dam member and the filler being located therebetween, and then curing the dam members and the filler to join the first substrate and the second substrate; and cutting the first substrate and the second substrate joined together to form a plurality of display devices each including the display area and the terminal area.

BRIEF DESCRIPTION OF DRAWINGS

FIG. 1(a) is a planar see-through view of the OLED display device, and FIG. 1(b) is a cross-sectional view of the OLED display device shown in FIG. 1(a);

FIG. 2(a) is a planar see-through view showing the production step of the OLED display devices, and FIG. 2(b) is a cross-sectional view of the OLED display device shown in FIG. 2(a) taken along line X-X' in FIG. 2(a);

FIG. 3(a) is a planar see-through view of the OLED display device, and FIG. 3(b) is a cross-sectional view of the OLED display device shown in FIG. 3(a);

FIG. 4(a) is a planar see-through view showing the production step of the OLED display devices, and FIG. 4(b) is a cross-sectional view of the OLED display device shown in FIG. 4(a) taken along line Y-Y' in FIG. 4(a);

FIG. 5(a) is a planar see-through view of the OLED display device, and FIG. 5(b) is a cross-sectional view of the OLED display device shown in FIG. 5(a);

FIG. 11(a) is a planar see-through view of the OLED display device, and FIG. 11(b) is a cross-sectional view of the OLED display device shown in FIG. 11(a);

FIG. 13(a) is a planar see-through view showing the production step of the OLED display devices, and FIG. 13(b) is a cross-sectional view of the OLED display device shown in FIG. 13(a) taken along line Z-Z' in FIG. 13(a).

DESCRIPTION OF EMBODIMENTS

Hereinafter, embodiments of the present invention will be described with reference to the drawings. The present invention is not limited to the following embodiments and may be carried out in any of various forms without departing from the gist thereof.

Figure 6:
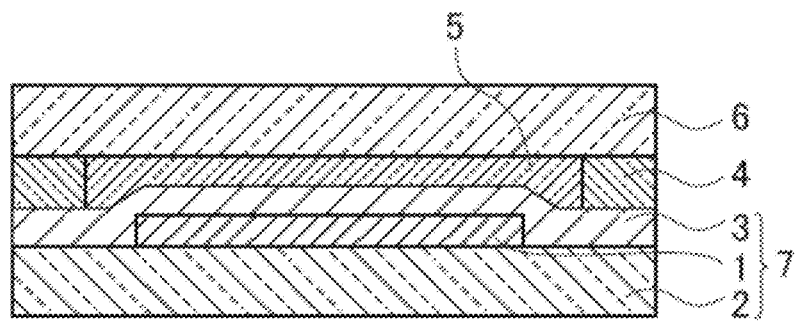
FIG. 6 is a cross-sectional view showing a schematic structure of a stacking configuration of an OLED display device.

With reference to FIG. 6, a schematic structure of an OLED display device according to an embodiment of the present invention will be described.

FIG. 6 is a vertical cross-sectional view showing a stacking configuration of the OLED display device. As shown in FIG. 6, an organic EL light emitting layer 1 is formed on a substrate 2 formed of a hard material such as glass or the like. Although FIG. 2 does not show the structure of the organic EL light emitting layer 1 in detail, the organic EL light emitting layer 1 includes, for example, a TFT driving circuit layer, a reflective electrode, a hole injection layer, a hole transport layer, a light emitting layer, an electron transport layer, an electron injection layer, and a transparent electrode which area stacked sequentially in this order from the side of the substrate 2.

The organic EL light emitting layer 1 is rapidly deteriorated when being exposed to moisture in an atmosphere, and thus needs to be sealed in against external air. Therefore, the organic EL light emitting layer 1 has a surface covered with a transparent sealing film 3 formed of, for example, a CVD-formed SiN film or the like, which is covered with a substrate 6 formed of a hard transparent material such as glass or the like.

In the OLED display device, a gap between the substrate 6 and the sealing film 3 is filled with, for example, transparent resins (ultraviolet-curable resin, thermosetting resin, etc.) 4 and 5 such as an epoxy resin or the like. Such a structure is provided in order to keep a certain distance between the substrate 6 and the sealing film 3 so that the surface of the organic EL light emitting layer 1 and a surface of the substrate 6 are kept parallel to each other, and also in order to prevent reflection or refraction at an interface between the substrate 6 and the sealing film 3. More specifically, the resin 4 having a relatively high pre-curing viscosity is formed in a frame shape, and a space enclosed by the resin 4 is filled with the resin 5 having a relatively low pre-curing viscosity. In this manner, the resin 4 having a relatively high pre-curing viscosity encloses the resin 5 having a relatively low pre-curing viscosity. Therefore, the resin 5 having a relatively low pre-curing viscosity can be spread uniformly on the surface of the sealing film 3 while being prevented from flowing out to the surrounding area even before being cured. The resin 4 has a role of damming up the resin 5 and thus will be referred to as a "dam material" herein, and when the dam material is formed into a frame shape, a linear shape or the like, such a frame-shaped or linear-shaped portion will be referred to as a "dam member". The resin 4 may also be referred to as a "sealing material" or the like in general. The resin 5 will be referred to as a "filler" herein, but may also be referred to as a "filling material" or the like in general.

Hereinafter, referring to FIG. 6, an assembly including the substrate 2, and the organic EL light emitting layer 1 and the sealing film 3 provided on the substrate 2 will be referred to as a "first substrate 7", and correspondingly, the substrate 6 will be referred to as a "second substrate 6". The second substrate 6 may include color filters depending on the specifications of the OLED display device, or may be formed of a thin film or the like having a touch panel function.

Hereinafter, with reference to FIG. 7 through FIG. 10, a production method for producing the OLED display device will be described. The OLED display device is produced by joining the first substrate 7 and the second substrate 6 to each other by use of the resins 4 and 5. The joining step is performed in a chamber included in a production apparatus (not shown).

Figure 7:
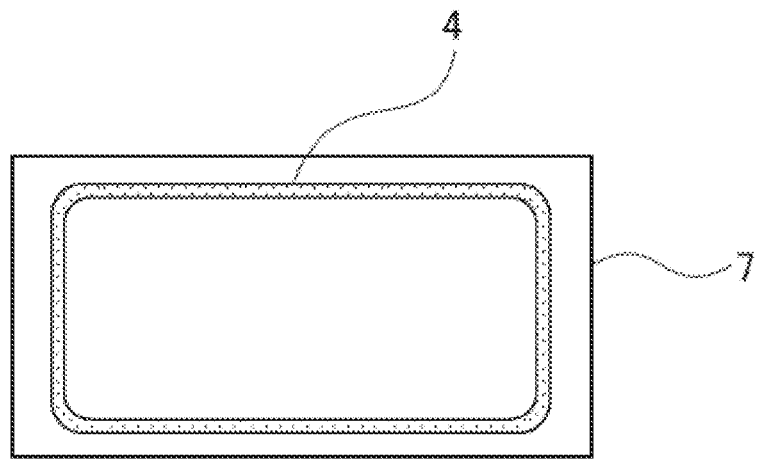
FIG. 7 shows a production step of the OLED display device.
Figure 8:
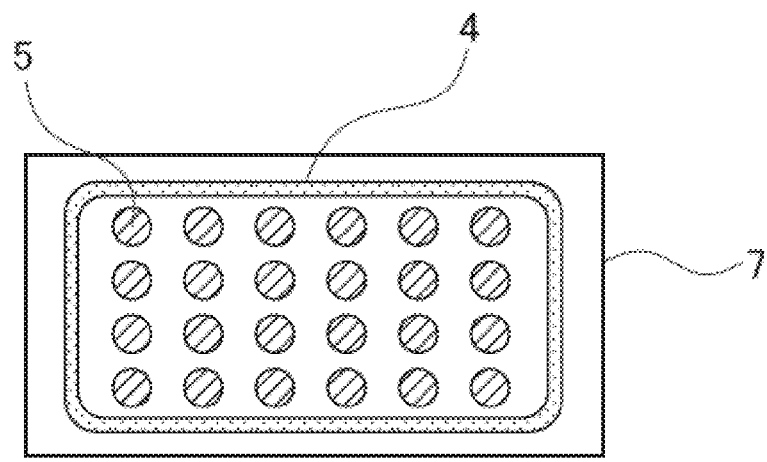
FIG. 8 shows a production step of the OLED display device.
Figure 9:
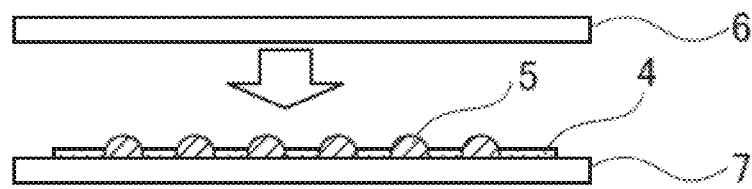
FIG. 9 shows a production step of the OLED display device.

First, referring to FIG. 7, the production apparatus (not shown) applies a dam material 4 to a surface of the first substrate 7 (surface of the sealing film shown in FIG. 6) by use of a dispenser or the like to form a dam member 4. Next, as shown in FIG. 8, the filler 5 is dripped to an area of the surface of the first substrate 7 that is inside with respect to the dam member 4, so that the filler 5 is provided in the form of a great number of dots at a uniform pitch. The filler 5 is dripped for the following reason. As shown in FIG. 9, the dripped filler 5 assumes spherical shapes because of the surface tension thereof. Therefore, merely the filler 5 provided in dots has a volume sufficiently large to fill the space inside with respect to the dam member 4.

Figure 10:
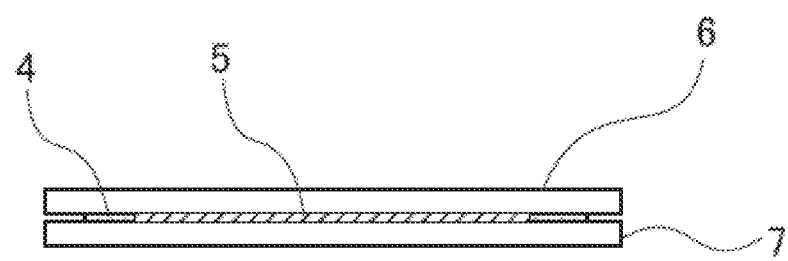
FIG. 10 shows a production step of the OLED display device.

Next, the production apparatus (not shown) significantly depressurizes the chamber, so that the first substrate 7 and the second substrate 6 are aligned to each other as shown in FIG. 9 and laid on top of each other as shown in FIG. 10. As a result, the filler 5 provided in dots in the space inside with respect to the dam member 4 are pushed to spread and fill gaps between the dots, and thus to fill the space enclosed by the substrates 6 and 7 and the dam member 4.

Then, the production apparatus (not shown) returns the pressure in the chamber to the atmospheric pressure, takes the substrates 6 and 7 put together out of the chamber, and cures the resins 4 and 5. In the case where, for example, the resin 4 used as the dam material 4 is an ultraviolet-curable resin and the resin 5 used as the filler 5 is a thermosetting resin, the dam member 4 is irradiated with ultraviolet rays through the second substrate 2 and then, the filler 5 is thermally cured in a heating furnace. The filler 5 may be thermally cured at a temperature of about 100° C., so that the material used to form the organic EL light emitting layer 1 is not deteriorated. The resins 4 and 5 may each be an ultraviolet-delay-curable resin. In this case, the resins 4 and 5 are irradiated with ultraviolet rays before the substrates 6 and 7 are laid on top of each other, so that the resins 4 and 5 start to be cured after the substrates 6 and 7 are laid on top of each other. Therefore, the resins 4 and 5 are completely cured in a curing furnace.

Figure 1:
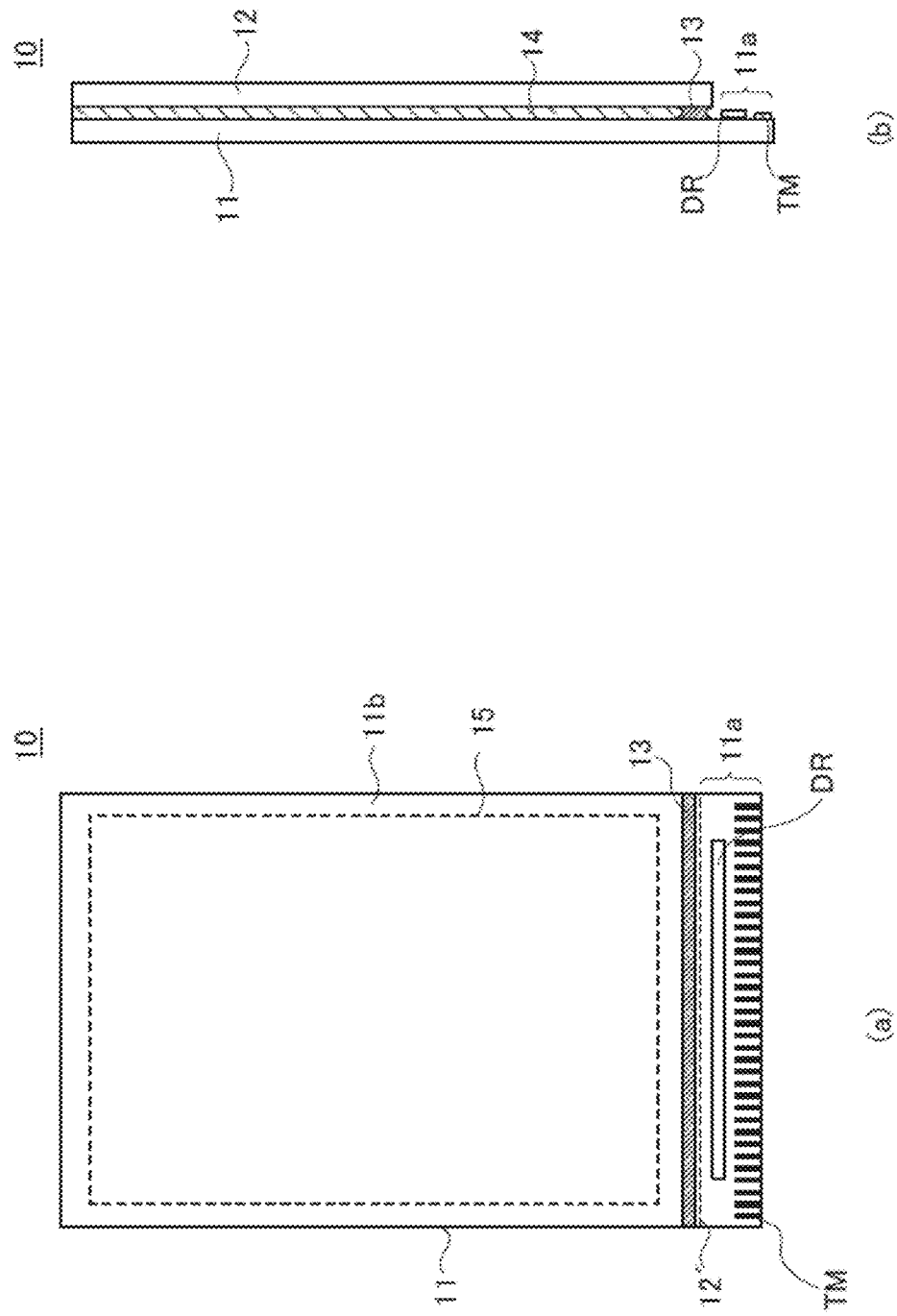
FIG. 1 shows a schematic structure of an OLED display device according to a first embodiment of the present invention.
Figure 2:
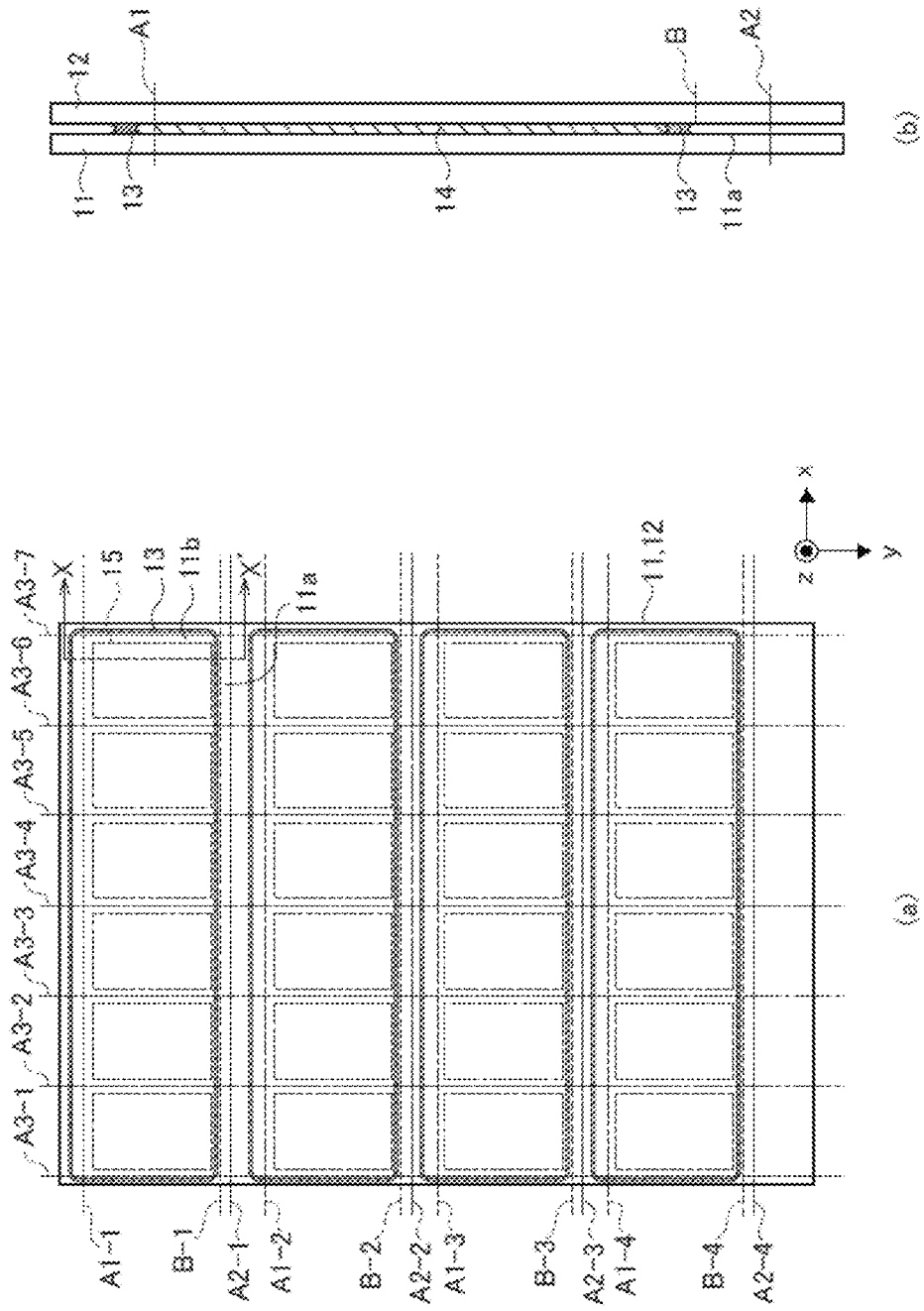
FIG. 2 shows a production step of the OLED display devices according to the first embodiment of the present invention.

With reference to FIG. 1 and FIG. 2, an OLED display device according to a first embodiment of the present invention which is produced by the above-described production method will be described.

First Embodiment

Structure of the OLED Display Device

FIG. 1 shows a schematic structure of an OLED display device 10 according to a first embodiment of the present invention. FIG. 1(a) is a planar see-through view of the OLED display device 10, and FIG. 1(b) is a cross-sectional view of the OLED display device 10 shown in FIG. 1(a).

As shown in FIGS. 1(a) and (b), the OLED display device 10 according to the first embodiment of the present invention includes a first substrate 11 including a display area 15 on which an image is to be displayed, a second substrate 12 located so as to face the first substrate 11, a dam member 13 located between the first substrate 21 and the second substrate 22 and extending along, and outside with respect to, a part of an outer edge of the display area 15, and a filler 14 used to fill a space enclosed by the first substrate 11, the second substrate 12 and the dam member 13.

FIG. 1(a) is a planar see-through view showing a shape of a surface of the first substrate 11 having the dam member 13 formed thereon. The first substrate 11 is seen through the second substrate 12 and the filler 14. Like the first substrate 7 described above with reference to FIG. 6, the first substrate 1 includes an organic EL light emitting layer 1 and a sealing film 3 formed on a substrate 2 sequentially in this order. The first substrate 11 includes the display area 15, a peripheral frame area 11b, and a terminal area 11a. The display area 15 includes a plurality of effective pixels in the organic EL light emitting layer 1 to display an image. The peripheral frame area 11b is formed so as to enclose the display area 15. On the peripheral frame area 11b, wiring lines or the like for transmitting a driving signal to a TFT driving circuit layer included in the organic EL light emitting layer 1 are provided. The terminal area 11a is projected from one side of an outer edge of the peripheral frame area 11b. On the terminal area 11a, drivers DR (source driver, gate driver) for driving the TFT driving circuit layer and terminals TM for supplying a signal to the display area 15 are provided. In this embodiment, the drivers DR are formed of a separate member from, and located on, the terminal area 11a of the first substrate 11. Alternatively, the drivers DR may be directly formed in the first substrate 11. The terminals TM are connected to a flexible printed circuit board (FPC) (not shown). In the case where the display area 15 is rectangular as shown in FIG. 1(a), the dam member 13 is formed between the terminal area 11a and the display area 15, along one of four sides of the display area 15. In this embodiment, the dam member 13 is located in a direction in which the terminals TM are arranged in a line.

The second substrate 12 is formed of a hard transparent material such as glass or the like so that light from the organic EL light emitting layer 1 formed in the first substrate 11 is transmitted through the second substrate 12. Although not shown, the second substrate 12 may include color filters, or may be formed of a thin film or the like having a touch panel function.

As shown in FIG. 1(b), the OLED display device 10 is formed by joining the first substrate 11 and the second substrate 12 with the dam member 13 and the filler 14 being provided therebetween so that the organic EL light emitting layer 1 is sealed in by the filler 14.

Hereinafter, with reference to FIG. 2, a method for producing the OLED display device 10 according to the first embodiment of the present invention will be described in more detail.

<Method for Producing the OLED Display Device>

FIG. 2 shows a production step of the OLED display devices 10 according to the first embodiment of the present invention. FIG. 2(a) is a planar see-through view showing the production step of the OLED display devices 10, and FIG. 2(b) is a cross-sectional view of the OLED display device 10 shown in FIG. 2(a) taken along line X-X' in FIG. 2(a). FIG. 2(a) is a planar see-through view showing a shape of a surface of the first substrate 11 having a plurality of the dam members 13 formed thereon. The first substrate 11 is seen through the second substrate 12 and the filler 14. In FIG. 2(a) and the like, an x direction represents a direction in which the terminals in each of the OLED display devices 10 are arranged in a line, a y direction represents a direction perpendicular to the x direction, and a z direction represents a thickness direction of the OLED display devices 10.

(1) Formation of the First Substrate 11

As shown in FIG. 2(a), the first substrate 11 has a plurality of the display areas 15 formed therein in a matrix at a predetermined interval therebetween. The terminal area 11a is located adjacent to each of the display areas 15 in the y direction shown in FIG. 2(a). On the terminal area 11a, drivers or the like for driving the TFT driving circuit layer included in the organic EL light emitting layer 1 in the display area 15 are formed. The peripheral frame area 11b, on which wiring lines or the like for transmitting a driving signal to the TFT driving circuit layer are provided, is formed so as to enclose each display area 15. The first substrate 11 is formed as follows, like the first substrate 7 described above with reference to FIG. 6. On the substrate 2 formed of a hard transparent material such as glass or the like, a plurality of the organic EL light emitting layers 1, a plurality of the terminal areas 11a and a plurality of peripheral frame areas 11b are formed. Then, the sealing film 3 is formed so as to cover the plurality of organic EL light emitting layers 1, the plurality of terminal areas 11a and the plurality of peripheral frame areas 11b.

(2) Formation of the Dam Members 13

Next, a resin having a relatively high pre-curing viscosity is applied to the surface of the first substrate 11 by use of a dispenser or the like to form the plurality of dam members 13. Each of the plurality of dam members 13 encloses each row of a plurality of display areas 15 located adjacent to each other in the x direction shown in FIG. 2(a). The resin having a relatively high pre-curing viscosity used to form the dam members 13 is, for example, an UV-curable or thermosetting transparent resin such as an epoxy-based resin, an acrylic resin or the like. Each dam member 13 encloses an assembly including each row of a plurality of display areas 15 adjacent to each other in the x direction and a plurality of peripheral frame areas 11b provided in correspondence with the row of display areas 15. In the x direction, each dam member 13 extends between each row of display areas 15 and the plurality of terminal areas 11a provided in correspondence with the row of display areas 15. Since the dam member 13 is provided between the display areas 15 and the terminal areas 11a, the filler 14 used to fill the space inside with respect to the dam member 13 in a later step of the production method is prevented from leaking out to the terminal areas 11a. The dam members 13 are provided to define areas which are to be filled with the filler 14, and therefore, are formed of a resin having a higher pre-curing viscosity than that of the resin used as the filler 14.

(3) Application of the Filler 14

Next, a resin having a relatively low pre-curing viscosity is dripped as the filler 14 to the areas inside with respect to the plurality of dam members 13. The filler 14 is dripped at a predetermined pitch in the x direction and the y direction perpendicular to each other (see FIG. 8). The filler 14 is, for example, a UV-curable or thermosetting transparent resin such as, for example, an epoxy resin, an acrylic resin or the like.

(4) Joining of the First Substrate 11 and the Second Substrate 12

Next, the second substrate 12 is put on the surface of the first substrate 11 in the chamber at a reduced pressure, and the filler 14 is spread in the entirety of each of areas enclosed by the substrates 11 and 12 and the dam members 13. Under the atmospheric pressure, the dam members 13 and the filler 14 are cured (see FIG. 9 and FIG. 10). Such a step of curing the dam members 13 and the filler 14 are performed as follows like the step described above with reference to FIG. 9 and FIG. 10. In the case where, for example, the dam members 13 are formed of an ultraviolet-curable resin and the filler 14 is formed of a thermosetting resin, the dam members 13 are irradiated with ultraviolet rays through the second substrate 12 and then, the filler 14 is thermally cured in a heating furnace. In this manner, as shown in FIGS. 2(a) and (b), the first substrate 11 and the second substrate 12 which are joined together with the organic EL light emitting layers 1 being sealed in by the dam members 13 and the filler 14 are obtained.

(5) Separation into Individual OLED Display Devices 10

The first substrate 11 and the second substrate 12 joined together are cut along cutting lines A1-1 through A1-4, A2-1 through A2-4, A3-1 through A3-7, and B-1 through B4 by use of a scribe and break technique or the like. The cutting lines A1-1 through A1-4 and A3-1 through A3-7 run inside with respect to the dam members 13, and are provided to form edges of the OLED display devices 10 on the sides on which the terminal areas 11a are not provided. The cutting lines A2-1 through A2-4 are provided to form edges of the OLED display devices 10 on the side on which the terminal areas 11a are provided. The cutting lines B-1 through B-4 are provided to cut away the second substrate 12 to expose the terminal areas 12a of the first substrate 11.

The first substrate 11 and the second substrate 12 joined together are cut along the cutting lines A1-1 through A1-4, A2-1 through A2-4, A3-1 through A3-7, and B-1 through B4 shown in FIGS. 2(a) and (b). As a result, the plurality of the OLED display devices 10 shown in FIGS. 1(a) and (b) are obtained.

Figure 11:
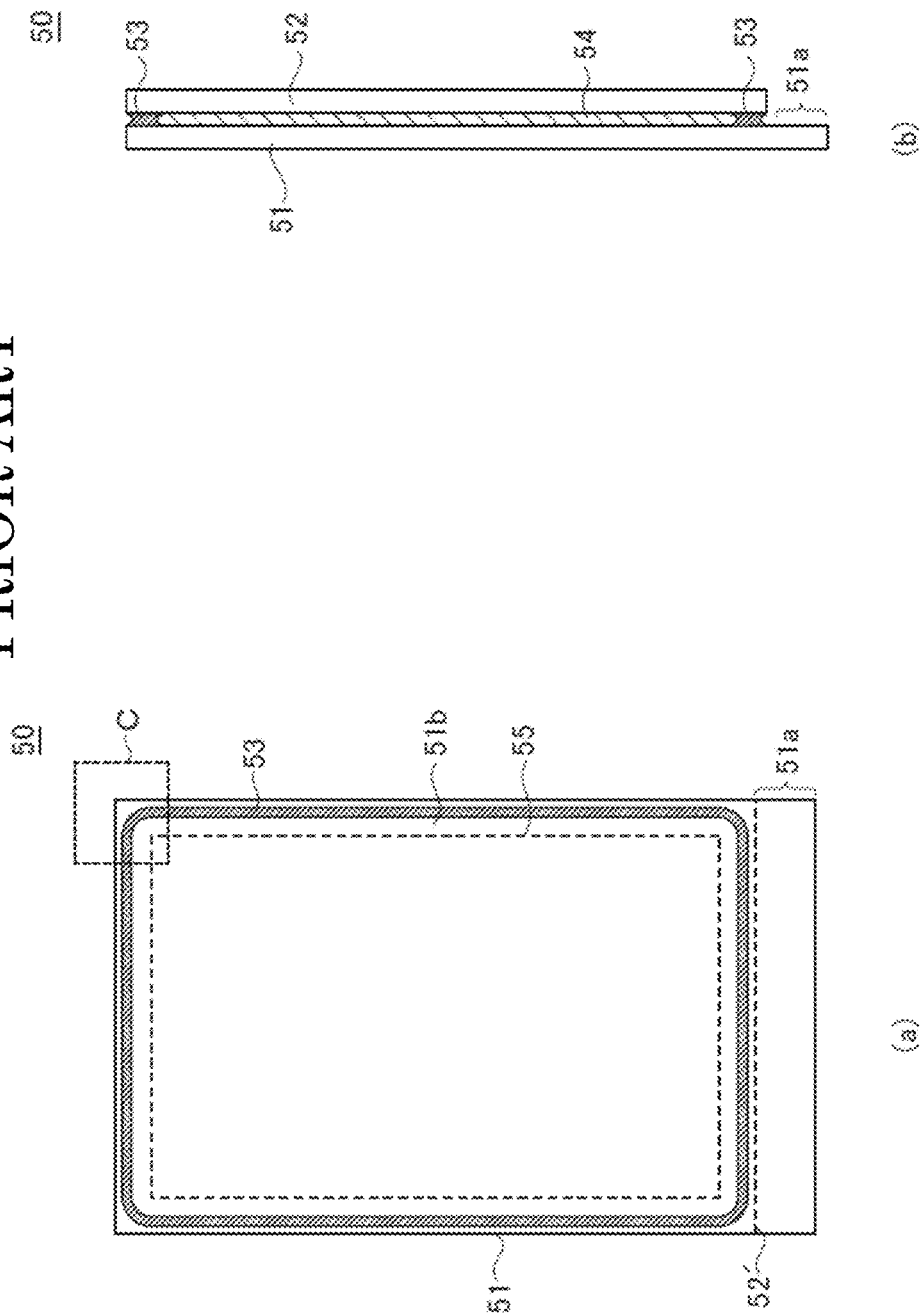
FIG. 11 shows a schematic structure of a conventional OLED display device.
Figure 12:
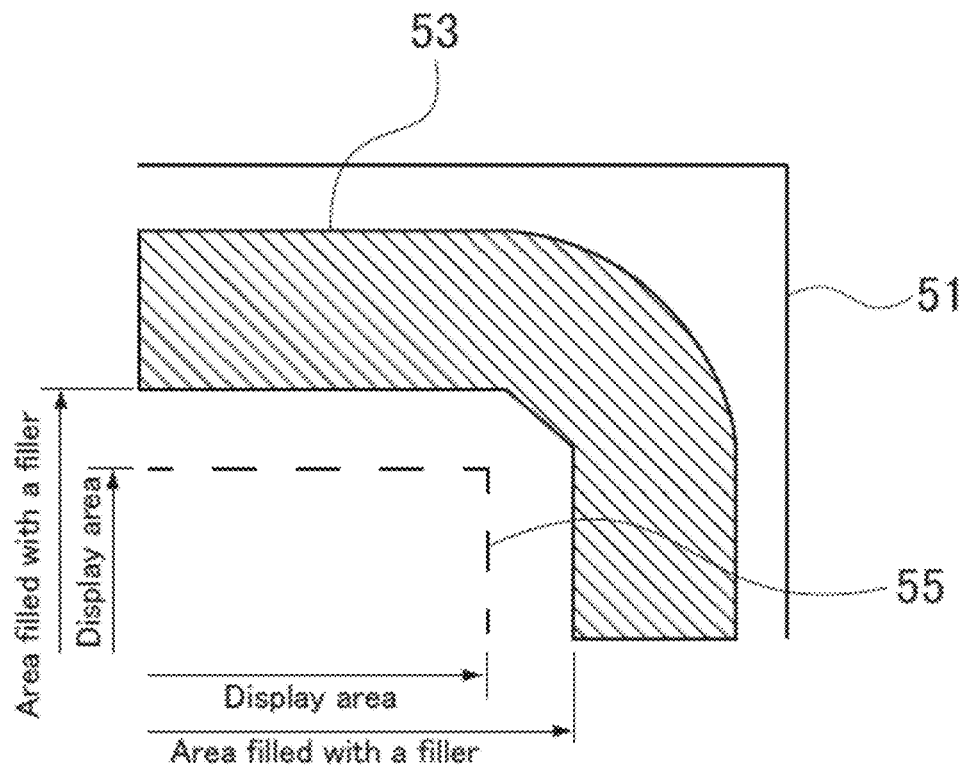
FIG. 12 is an enlarged view of part C enclosed by dashed line in FIG. 11(a)
Figure 13:
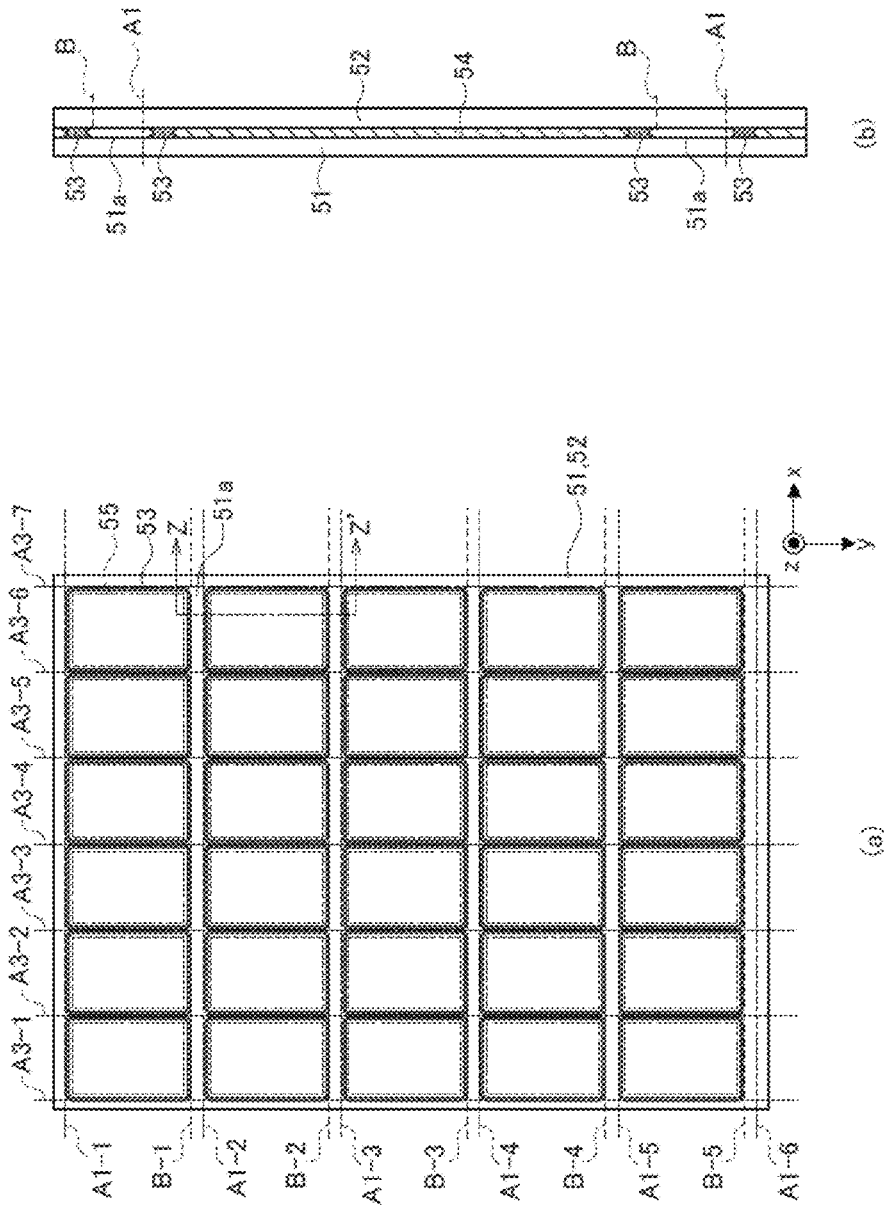
FIG. 13 shows a production step of the conventional OLED display devices.

As shown in FIG. 1(a), the OLED display device 10 according to the first embodiment of the present invention does not have the dam member 13 along the outer edge of the display area 15 except for the side on which the terminal area 11a is provided. Namely, the dam member 13 is formed adjacent to a first side of the display area 15 along which the terminal area 11a is provided, and extends linearly in the direction where the first side extends (in the x direction shown in FIG. 2(a)). Unlike in the conventional OLED display device 50 described above with reference to FIG. 11(a), the dam member 13 of the OLED display device 10 according to the first embodiment of the present invention does not need to have a frame shape. This is because the filler 14 is cured to be completely solid, and thus has a moisture blocking function. Therefore, the OLED display device 10 according to the first embodiment of the present invention does not need to have an area where the dam member 13 is to be formed except for a border area between the terminal area 11a and the display area 15. Therefore, the peripheral frame area of the OLED display device 10 can have a smaller size.

The display device 10 according to the first embodiment of the present invention may have a structure in which the wiring lines or the like are not provided on a part of the peripheral frame area 11b on the side facing the terminal area 11a. This can further decrease the width of this part of the peripheral frame area 11b, and the peripheral frame area of the OLED display device 10 can have a still smaller size.

As described above, according to the OLED display device 10 and the method for producing the same in the first embodiment of the present invention, the dam member 13 does not need to be formed in a frame shape enclosing the display area 15. Thus, the peripheral frame area can have a smaller size. In the step of forming the dam members 13, the dam material is applied to draw a shape enclosing each row of display areas 15 adjacent to each other in the x direction. As compared with the case where the dam member 53 is formed by applying the dam material to draw a frame shape enclosing each display area 55, the total length of the dam material used to form the dam members 13 can be shorter. This can shorten the time for this step and thus can reduce the material cost. Therefore, according to the first embodiment of the present invention, the OLED display device 10 with a narrow peripheral frame area can be provided at reduced material cost and thus at reduced production cost.

According to the OLED display device 10 and the method for producing the same in the first example of the present invention described above, the first substrate 11 and the second substrate 12 are cut along lines running inside with respect to the dam members 13 as shown in FIG. 2(a). Therefore, the areas which are between the cutting lines A2-1 through A2-3 and the cutting lines A1-1 through A1-4 and include a part of the dam members 13 are abolished. In order to avoid such waste and put priority on the area efficiency, a second embodiment of the present invention provides OLED display devices 20 and a method for producing the same in which the first substrate and the second substrate are cut along lines running outside with respect to the dam members. According to such a structure, the area efficiency is higher than that of the first embodiment. The peripheral frame area is smaller, and the area efficiency is higher, than those of the conventional OLED display device. Now, the OLED display device 20 and a method for producing the same according to the second embodiment of the present invention will be described.

Second Embodiment

Structure of the OLED Display Device

Figure 3:
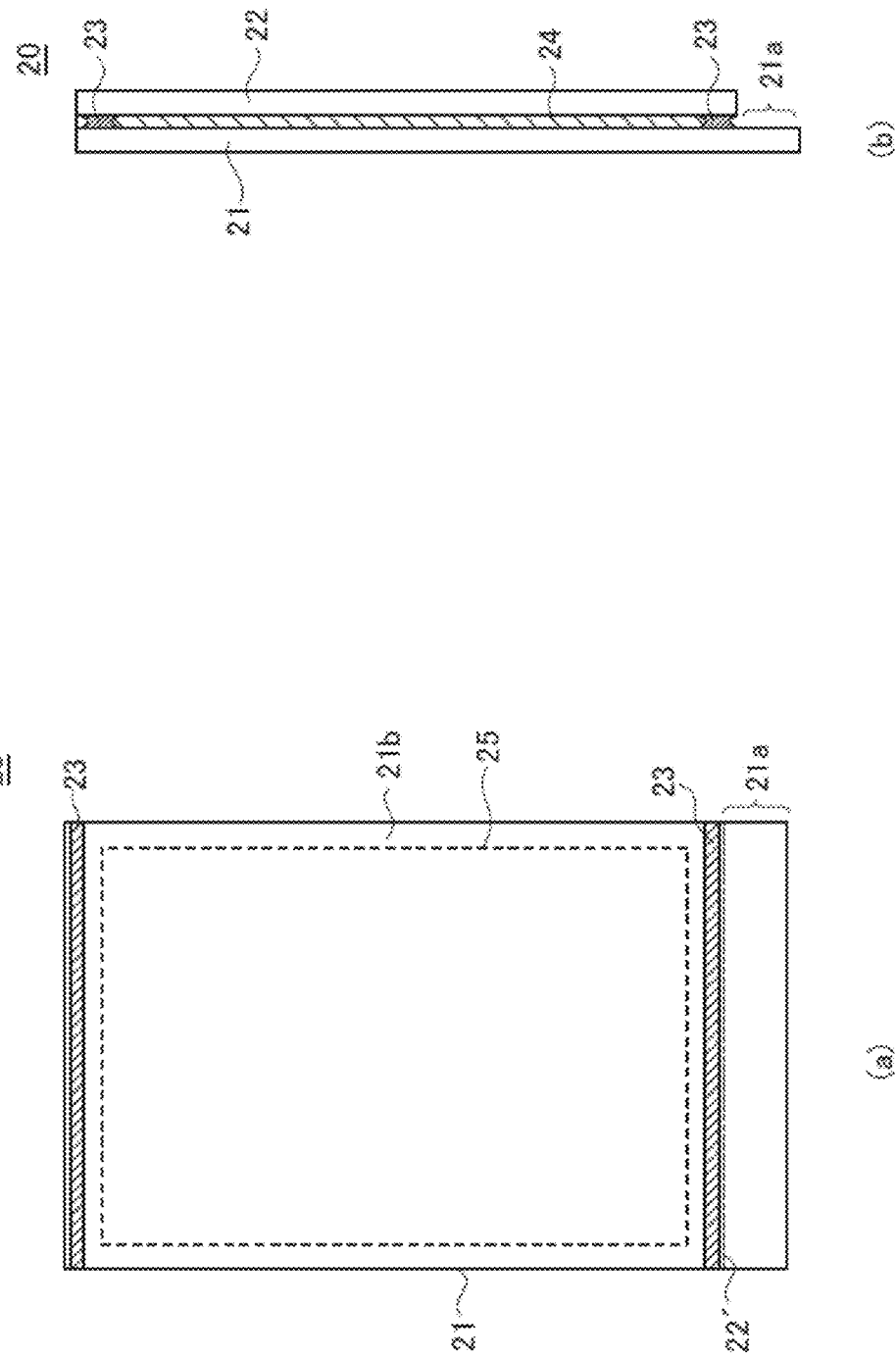
FIG. 3 shows a schematic structure of an OLED display device according to a second embodiment of the present invention.

FIG. 3 shows a schematic structure of an OLED display device 20 according to the second embodiment of the present invention. FIG. 3(a) is a planar see-through view of the OLED display device 20, and FIG. 3(b) is a cross-sectional view of the OLED display device 20 shown in FIG. 3(a).

As shown in FIGS. 3(a) and (b), the OLED display device 20 according to the second embodiment of the present invention includes a first substrate 21 including a display area 25 on which an image is to be displayed, a second substrate 22 located so as to face the first substrate 21, a dam member 23 located between the first substrate 21 and the second substrate 22 and extending along, and outside with respect to, a part of an outer edge of the display area 25, and a filler 24 used to fill a space enclosed by the first substrate 21, the second substrate 22 and the dam member 23.

In the OLED display device 20 according to the second embodiment of the present invention, unlike in the OLED display device 10 according to the first embodiment of the present invention, the dam member 23 is provided along a border between an terminal area 21a and the display area 25 and also along a part of an outer edge of the display area 25 on the side facing the terminal area 21a. In this manner, in the case where the display area 25 is rectangular as shown in FIG. 3(a), the dam member 23 is located along two sides facing each other in the y direction shown in FIG. 2(a) out of the four sides of the outer edge of the display area 25.

Hereinafter, with reference to FIG. 4, a method for producing the OLED display device 20 according to the second embodiment of the present invention will be described in more detail. The steps which are the same as those of the production method according to the first embodiment of the present invention described above will not be described.

<Method for Producing the OLED Display Device>

Figure 4:
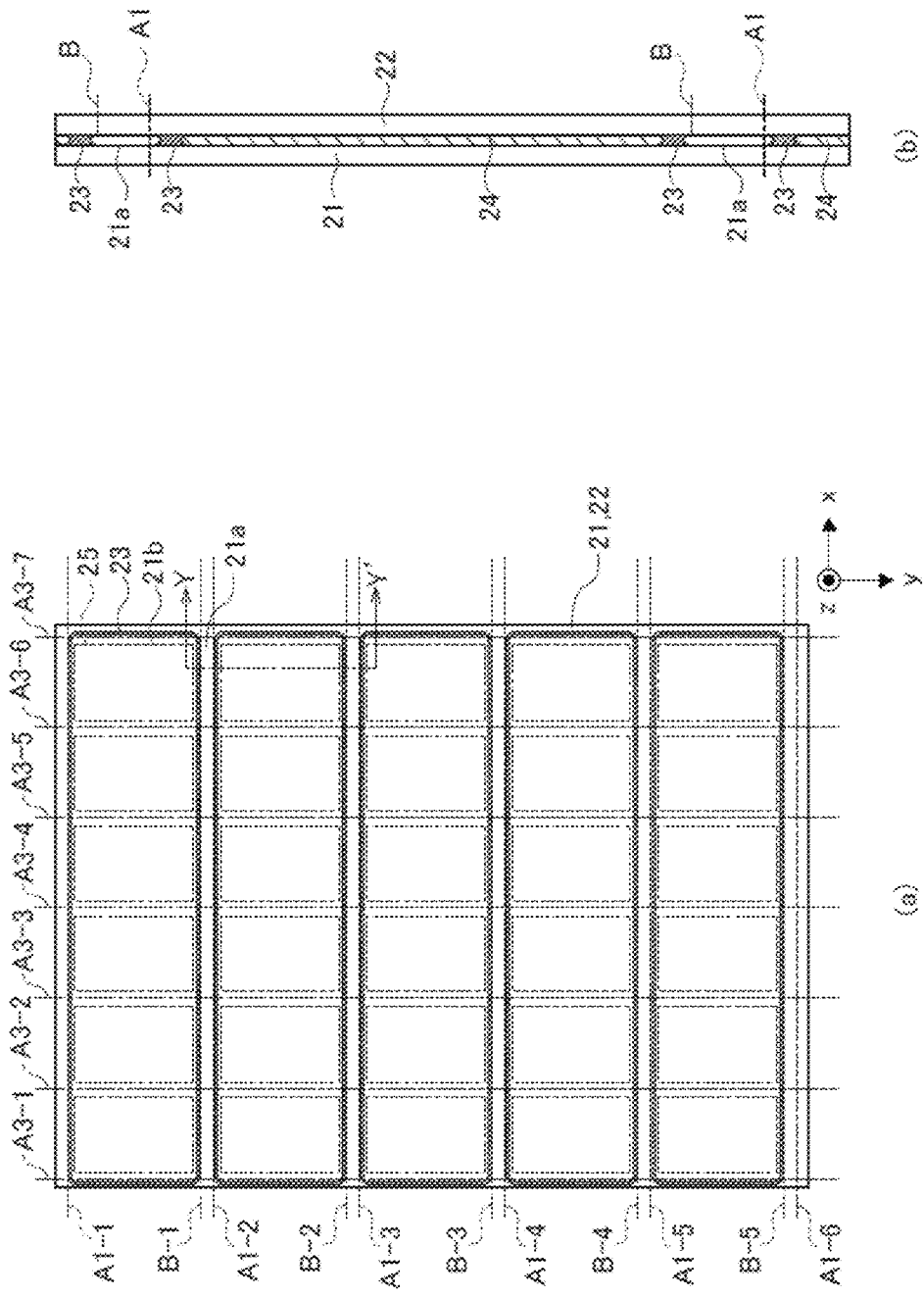
FIG. 4 shows a production step of the OLED display devices according to the second embodiment of the present invention.

FIG. 4 shows a production step of the OLED display devices 20 according to the second embodiment of the present invention. FIG. 4(a) is a planar see-through view showing the production step of the OLED display devices 20, and FIG. 4(b) is a cross-sectional view of the OLED display device 20 shown in FIG. 4(a) taken along line Y-Y' in FIG. 4(a). FIG. 4(a) is a planar see-through view showing a shape of a surface of the first substrate 21 having a plurality of the dam members 23 formed thereon. The first substrate 21 is seen through the second substrate 22 and the filler 24.

(1) Formation of the First Substrate 21

As shown in FIG. 4(a), the first substrate 21 has a plurality of the display areas 25 formed therein in a matrix at a predetermined interval therebetween. The terminal area 21a is located adjacent to each of the display areas 25 in the y direction. A peripheral frame area 21b is formed so as to enclose each display area 25. The first substrate 21 is formed as follows, like the first substrate 11 according to the first embodiment. On the substrate 2 formed of a hard transparent material such as glass or the like, a plurality of the organic EL light emitting layers 1, a plurality of the terminal areas 21a and a plurality of the peripheral frame areas 21b are formed. Then, the sealing film 3 is formed so as to cover the plurality of organic EL light emitting layers 1, the plurality of terminal areas 21a and the plurality of peripheral frame areas 21b.

(2) Formation of the Dam Members 23

Next, a resin having a relatively high pre-curing viscosity is applied to the surface of the first substrate 21 by use of a dispenser or the like to form the plurality of dam members 23. Each of the plurality of dam members 23 encloses each row of a plurality of display areas 25 located adjacent to each other in the x direction shown in FIG. 4(a). Each dam member 23 encloses an assembly including each row of display areas 25 adjacent to each other in the x direction and a plurality of peripheral frame areas 21b provided in correspondence with the row of display areas 25. In the x direction, each dam member 23 extends between each row of display areas 25 and the plurality of terminal areas 21a formed in correspondence with the row of display areas 25.

As shown in FIG. 4(a), in the second embodiment, the dam members 25 are provided while having the terminal areas 21a therebetween but having almost no marginal space in the y direction, unlike the dam members 13 in the first embodiment shown in FIG. 2(a). This is because on the first substrate 21, areas which define the OLED display devices 20 each including the display area 25 and the terminal area 21a are located continuously in the y direction. Such a structure provides the following effect. It is now assumed that the first substrate 11 in the first embodiment and the first substrate 21 in the second embodiment have the same area size. As shown in FIG. 2(a), on the first substrate 11 in the first embodiment, areas which define the OLED display devices 10 are located while having a marginal space therebetween in the y direction. Therefore, for example, four rows of OLED display devices 10 are defined in the y direction. By contrast, as shown in FIG. 4(a), on the first substrate 21 in the second embodiment, the areas which define the OLED display devices 20 are located continuously in the y direction. Therefore, for example, five rows of OLED display devices 20 are defined in the y direction. In this manner, the area efficiency is improved in the second embodiment.

(3) Application of the Filler 24

Next, a resin having a relatively low pre-curing viscosity is dripped as the filler 24 to the areas inside with respect to the plurality of dam members 23. The filler 24 is dripped at a predetermined pitch in the x direction and the y direction perpendicular to each other.

(4) Joining of the First Substrate 21 and the Second Substrate 22

Next, the second substrate 22 is put on the surface of the first substrate 21 in the chamber at a reduced pressure, and the filler 24 is spread in the entirety of each of areas enclosed by the substrates 21 and 22 and the dam members 23. Under the atmospheric pressure, the dam members 23 and the filler 24 are cured. As a result, as shown in FIGS. 4(a) and (b), the first substrate 21 and the second substrate 22 which are joined together with the organic EL light emitting layers 1 being sealed in by the dam members 23 and the filler 24 are obtained.

(5) Separation into Individual OLED Display Devices 20

The first substrate 21 and the second substrate 22 joined together are cut along cutting lines A1-1 through A1-6, A3-1 through A3-7, and B-1 through B5 by use of a scribe and break technique or the like. The cutting lines A1-1 through A1-6 run outside with respect to the dam members 23, and are provided to form edges of the OLED display devices 20 on the sides facing each other in the y direction. The cutting lines A3-1 through A3-7 run inside with respect to the dam members 23, and are provided to form edges of the OLED display devices 20 on the sides facing each other in the x direction. The cutting lines B-1 through B-5 are provided to cut away the second substrate 22 to expose the terminal areas 22a of the first substrate 21.

The first substrate 21 and the second substrate 22 joined together are cut along the cutting lines A1-1 through A1-6, A3-1 through A3-7, and B-1 through B5 shown in FIGS. 4(a) and (b). As a result, the plurality of the OLED display devices 20 shown in FIGS. 3(a) and (b) are obtained.

As shown in FIG. 4(a), the OLED display device 20 according to the second embodiment of the present invention does not have the dam member 23 along parts of the outer edge of the display area 25 on the sides facing each other in the x direction. Namely, as shown in FIG. 3(a), the dam member 23 includes a first linear portion which is located adjacent to a first side of the display area 25 along which the terminal area 21a is provided and linearly extends in a direction in which the first side extends (x direction), and a second linear portion which is located adjacent to a second side of the display area 25 that faces the first side in the y direction and linearly extends in a direction in which the second side extends (x direction). The filler 24 is provided on the first substrate 21 from an end to another end thereof in the x direction to cover the display area 25. Therefore, in the OLED display device 20 according to the second embodiment of the present invention, the dam member 23 is formed only along the border between the terminal area 21a and the display area 25 and along a part of the outer edge of the display area 25 on the side facing the terminal area 21a. Therefore, a frame-shaped area for the dam member 23 does not need to be preserved in the peripheral frame area 21b enclosing the display area 25. Thus, the peripheral frame area of the OLED display device 20 can have a smaller size.

According to the OLED display device 20 and the method for producing the same in the second embodiment of the present invention, as shown in FIG. 4(a), the areas which define the OLED display devices 20 are located continuously in the y direction, and thus the marginal area which is to be abolished after the cutting step is reduced. This improves the area efficiency and reduces the material cost.

As described above, according to the OLED display device 20 and the method for producing the same in the second embodiment of the present invention, the dam member 23 does not need to be formed in a frame shape enclosing the display area 25. Thus, the size of the peripheral frame area can be easily decreased. In the step of forming the dam members 23, the dam material is applied to draw a shape enclosing each row of display areas 25 adjacent to each other in the x direction. As compared with the case where the dam member 53 is formed by applying the dam material to draw a frame shape enclosing each display area 55, the total length of the dam material used to form the dam members 23 can be shorter. This can shorten the time for this step and thus can reduce the material cost. Therefore, according to the second embodiment of the present invention, the OLED display device 20 with a narrow peripheral frame area can be provided at reduced material cost and thus at reduced production cost.

Hereinafter, an OLED display device 30 and a method for producing the same according to a third embodiment of the present invention will be described as a modification of the second embodiment.

Third Embodiment

Structure of the OLED Display Device

Figure 5:
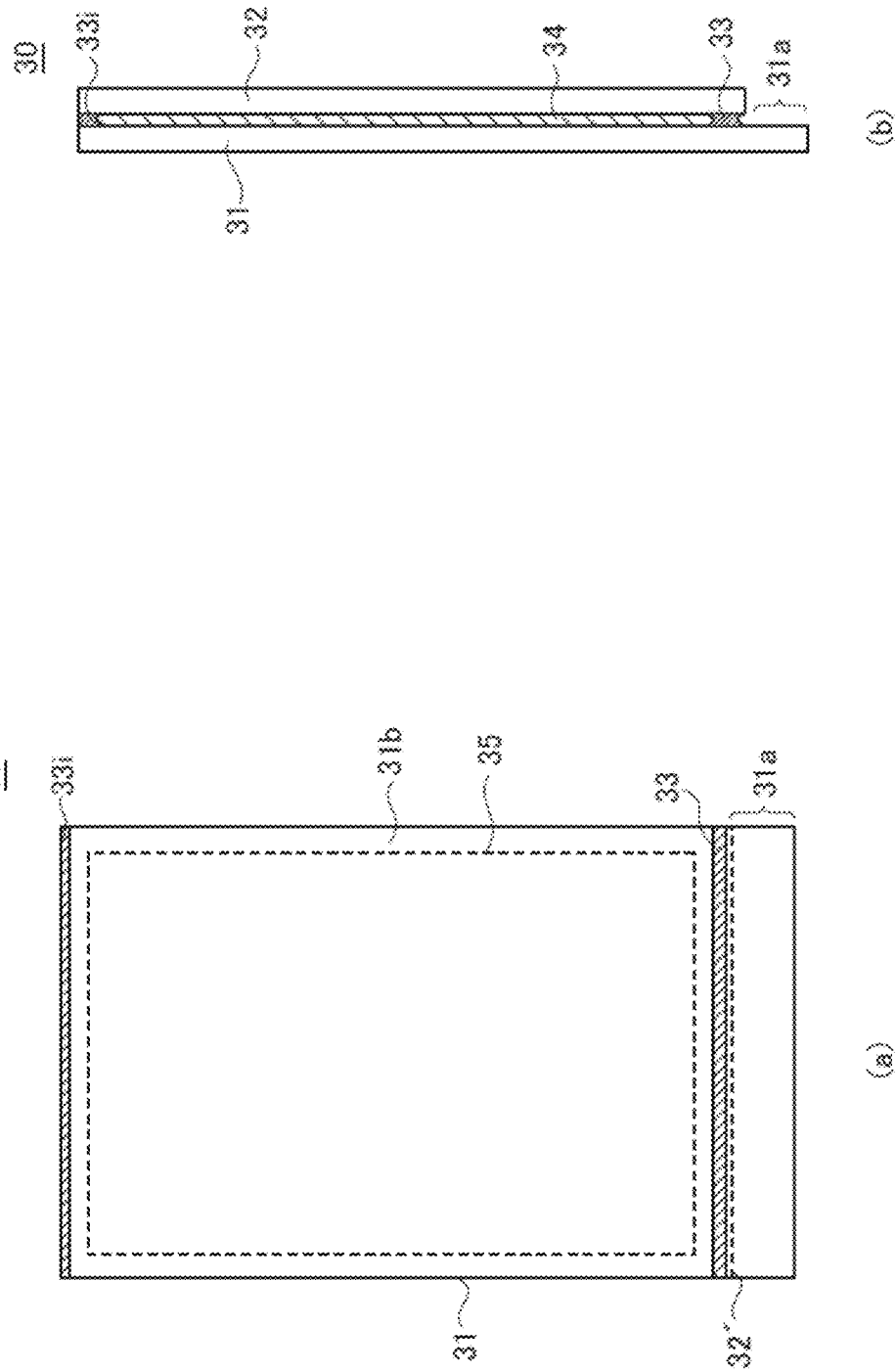
FIG. 5 shows a schematic structure of an OLED display device according to a third embodiment of the present invention.

FIG. 5 shows a schematic structure of the OLED display device 30 according to the third embodiment of the present invention. FIG. 5(a) is a planar see-through view of the OLED display device 30, and FIG. 5(b) is a cross-sectional view of the OLED display device 30 shown in FIG. 5(a).

As shown in FIGS. 5(a) and (b), the OLED display device 30 according to the third embodiment of the present invention includes a first substrate 31 including a display area 35 on which an image is to be displayed, a second substrate 32 located so as to face the first substrate 31, a dam member 33 located between the first substrate 31 and the second substrate 32 and extending along, and outside with respect to, a part of an outer edge of the display area 35, and a filler 34 used to fill a space enclosed by the first substrate 31, the second substrate 32 and the dam member 33.

The OLED display device 30 according to the third embodiment of the present invention is produced by substantially the same method as the OLED display device 20 according to the second embodiment shown in FIG. 4 except for the step of separation into individual OLED display devices 30. Accordingly, elements substantially the same as those of the OLED display device 20 according to the second embodiment will not be described in detail.

As shown in FIG. 5(a), in the OLED display device 30 according to the third embodiment, like in the OLED display device 20 according to the second embodiment, the dam member 33 is formed along a border between an terminal area 31a and the display area 35, and a dam member 33' is formed along a part of the outer edge of the display area 35 on the side facing the terminal area 31a. Unlike the OLED display device 20 according to the second embodiment, the OLED display device 30 according to the third embodiment is obtained by the following separation step. The first substrate 31 and the second substrate 32 joined together are cut along a line extending on, and in a longitudinal direction of, the dam member 33i (x direction in FIG. 4(a)) formed along the part of the outer edge on the side facing the terminal area 31a. Therefore, in the OLED display device 30 according to the third embodiment, as compared with the OLED display device 20 according to the second embodiment, the width of the part of the peripheral frame area 31b that includes the dam member 33' on the side facing the terminal area 31a and does not contribute to display can be decreased. Thus, according to the third embodiment of the present invention, the OLED display device 30 with a narrower peripheral frame area than that of the OLED display device 20 in the second embodiment can be provided.

As described above, the OLED display devices 10, 20 and 30 according to the first through third embodiments of the present invention can be produced by a simple production method at reduced material cost, and have a narrow peripheral frame area.

What is claimed is:

1. A display device, comprising:
a first substrate including a display area having an organic EL light emitting layer;
a second substrate located so as to face the first substrate;
a dam member located along, and outside with respect to, a part of an outer edge of the display area, wherein the dam member joins the first substrate and the second substrate to each other, and surrounds less than an entirety of the display area; and
a filler filling a space between the first substrate and the second substrate while being in contact with the dam member.

2. A display device according to claim 1, wherein the first substrate includes a terminal area which is separated from the display area.

3. A display device according to claim 1, wherein the display area is rectangular, and the dam member is located along only one side of the outer edge of the display area.

4. A display device according to claim 1, wherein the display area is rectangular, and the dam member is located along only two sides of the outer edge of the display area that face each other, the only two sides facing each other.

5. A display device according to claim 1, wherein the dam member and the filler are each formed of a transparent resin, and the resin used to form the dam member has a higher pre-curing viscosity than that of the resin used to form the filler.

6. A display device, comprising:
a first substrate including a display area, which includes an organic EL light emitting layer;
a second substrate located so as to face the first substrate;
a dam member located outside with respect to the display area, wherein the dam member joins the first substrate and the second substrate to each other, and surrounds less than an entirety of the display area; and
a filler filling a space between the first substrate and the second substrate while being in contact with the dam member; wherein the dam member includes a first linear portion which is located adjacent to a first side of the display area and linearly extends in a direction in which the first side extends.

7. A display device according to claim 6, wherein the first substrate includes a terminal area which is separated from the display area by the first linear portion of the dam member.

8. A display device according to claim 7, wherein: the display area has a second side facing the first side; and the dam member includes a second linear portion which is located adjacent to the second side and linearly extends in a direction in which the second side extends.

9. A display device according to claim 8, wherein the filler is provided on the first substrate from an end to another end thereof in the direction in which the first side extends to cover the display area.

10. A method for producing a display device, comprising:
forming a plurality of organic EL light emitting layers, each of which is included in a display area on which an image is to be formed, in the first substrate in a matrix at a predetermined interval, and forming a plurality of terminal areas respectively adjacent to the plurality of display areas in a first direction;
forming a sealing film on the first substrate in which the plurality of organic EL light emitting layers and the plurality of terminal areas are formed;
forming a plurality of dam members on the sealing film, wherein the plurality of dam members extend in a second direction, perpendicular to the first direction, between the display areas and the terminal areas, and each of the dam members encloses a row of a plurality of display areas adjacent to each other in the second direction;
filling a space enclosed by each of the dam members with a filler;
putting the first substrate and the second substrate together with the dam member and the filler being located therebetween, and then curing the dam members and the filler to join the first substrate and the second substrate; and
cutting the first substrate and the second substrate joined together in the second direction, inside with respect to the plurality of dam members to form a plurality of display devices each including the display area and the terminal area.

11. A display device according to claim 6,
wherein the display area has a second side, and the dam member is not located adjacent to the second side of the display area.

12. A display device according to claim 11,
wherein the first substrate has a first end side, which is along the second side of the display area,
the filler is located from the first end side to the second side of the display area.

13. A display device according to claim 6, wherein the display area has a second side which faces the first side, the dam member consists of the first linear portion and a second linear portion, the second linear portion being located adjacent to the second side and linearly extending in a direction in which the second side extends.

14. A display device according to claim 6, wherein the display are has a second side and a third side parallel to the second side, the first substrate has a first end side along the second side of the display and a second end side along the third side of the display area, and the filler is located on the first substrate from the first end side to the second end side.

* * * * *